(12) United States Patent
Shahabuddin et al.

(10) Patent No.: US 7,313,511 B2
(45) Date of Patent: Dec. 25, 2007

(54) METHOD AND APPARATUS FOR COMPUTER SIMULATION OF FLIGHT TEST BEDS

(75) Inventors: Mohammad Shahabuddin, Pomona, CA (US); William K. Reinholtz, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 624 days.

(21) Appl. No.: 10/635,392

(22) Filed: Aug. 6, 2003

(65) Prior Publication Data

US 2004/0102946 A1    May 27, 2004

Related U.S. Application Data

(60) Provisional application No. 60/405,110, filed on Aug. 21, 2002.

(51) Int. Cl.
*G06F 17/50* (2006.01)
(52) U.S. Cl. .............................. 703/19; 703/13; 703/17; 703/22
(58) Field of Classification Search .................. 703/13, 703/17, 19, 22
See application file for complete search history.

(56) References Cited

U.S. PATENT DOCUMENTS 6,230,114 B1 *   5/2001   Hellestrand et al. .......... 703/13
6,804,636 B2 * 10/2004   Senta et al. ..................... 703/13
6,980,945 B2 * 12/2005   Elias ............................. 703/17
6,993,469 B1 *  1/2006   Bortfeld ........................ 703/15

OTHER PUBLICATIONS

Paoli et al., "HyperReal: A Modular Control Architecture for HRT Systems", Journal of Systems Architecture, vol. 42, Issues 6-7, Dec. 1996, pp. 477-487.*

* cited by examiner

*Primary Examiner*—Kamini Shah
*Assistant Examiner*—Herng-der Day
(74) *Attorney, Agent, or Firm*—Myers Dawes Andras & Sherman LLP

(57) ABSTRACT

Virtual Real Time (VRT) provides high fidelity timing for software simulator environment running in a workstation. VRT is scalable and controllable. VRT provides flight and simulation software synchronization mechanism. This feature guarantees that the causality effect between flight software when interacting with simulated devices is the same as running flight software in a real test-bed environment. VRT provides high-resolution timing, which facilitates monitoring and detection of timing related faults while running the simulation software system on a workstation. VRT is modularized, such that the switchover from virtual clock to real clock is a trivial task. Running the system on a workstation using VRT behaves exactly like a real system, with the added benefits of user controllable features such as start, stop, monitor and time-scale. Performance of systems running with VRT is generally very good, equal to or better than the hardware, as the software runs natively on a faster workstation.

16 Claims, 5 Drawing Sheets

METHOD AND APPARATUS FOR COMPUTER SIMULATION OF FLIGHT TEST BEDS

RELATED APPLICATIONS

The present application is related to U.S. Provisional Patent Application Ser. No. 60/405,110, filed on Aug. 21, 2002, which is incorporated herein by reference and to which priority is claimed pursuant to 35 USC 119.

BACKGROUND OF THE INVENTION

1. Field of the Invention

The invention relates to the field of simulation systems and methods and in particular to systems and methods for simulation of space flights.

2. Description of the Prior Art

Development of flight software for an embedded system is traditionally done on a flight-like test-bed. Flight-like test-beds are usually expensive and hence very few are made. While it seems appropriate to perform software testing on the target hardware, its use is often limited to the developers. While software simulators that run on workstation are getting popular for testing and verification of software, yet these software simulators do not provide accurate hardware platform timing. Without being able to simulate with realistic timing, which reflect the real hardware, one cannot depend on simulation for accurately verifying and testing flight software.

The four necessary ingredients of high fidelity software simulation in order to accurately simulate the actual hardware are: 1) high fidelity algorithms, 2) accurate representation of state machines, 3) high fidelity transactions and 4) high fidelity timing. Most of the industry high fidelity simulators come with the ingredients #1, 2, and 3. Ingredient #4, one of the most important, to validate timing, is either approximated or detailed. Timing approximation is implemented in a functional simulator by running flight software on a workstation by either cross-compiling or writing highly portable code. Timing detail is implemented by running the flight software on a simulated CPU. Timing approximation does not provide high fidelity simulation. Timing detail provides high fidelity simulation, but cannot keep-up with the performance of the real hardware. High fidelity simulators, in order to be usable by a large community of software developers, should provide reasonable performance usually equal to or better than real hardware.

High fidelity software simulators representing accurate functionality and timing of real hardware with good performance on workstations, have enormous value to the space flight projects. High fidelity simulators can help develop and test 80-90% of software in a workstation environment. This improves the productivity and time to develop the software, as simulated software test beds could be made available to everyone on the project at minimal cost. Simulation-based desktop and laptop workstation test beds provide many advantages over hardware-in-the-loop test beds. A software simulator provides much more flexibility and ease of use in terms of monitoring and detecting faults than hardware test beds. The software test beds can run many times faster than the real hardware provided the simulator allows scalability.

Two major types of closed-loop spacecraft simulators that run on a workstation have been used at JPL in the past, Instruction Level Simulation (ILS) and Functional level Simulation (FLS).

In an ILS simulator infrastructure flight software runs on an Instruction-level CPU software model along with functional software models of hardware busses, sensors, actuators and other avionic models with their interfaces simulated at low-level abstraction. JPL's High Speed Simulator (HSS) is an ILS, which was used for Cassini and Galileo spacecraft simulation.

In an FLS simulator infrastructure flight software is cross-compiled for a workstation along with functional models of hardware busses, sensors, actuators and other avionic models with their interfaces simulated at low-level abstraction. JPL's Flight Software Development System (FSDS) is a FLS, which is being used for Cassini spacecraft simulation.

ILS simulators are of the highest fidelity with very close timing accuracy when results are compared to real hardware, as the timing is simulated at CPU instruction level. Instruction timing is implemented from manufacturer's CPU instruction specification. In ILS no changes are required in the flight software source code. Disadvantage of ILS is that it cannot keep-up with the performance of real hardware as simulation model is developed at low-level of abstraction. ILS simulators are very expensive to develop. FLS simulators have medium level fidelity. In FLS even though the interfaces are simulated at low-level abstraction, yet the timing cannot be accurately represented since the software is cross-compiled for a workstation. Timing in FLS represents the calculated or measured transaction time of the real hardware, which is an approximation. In FLS changes are made in the flight software to be able to run on a workstation. FLS development is relatively inexpensive compared to ILS development. ILS provides high fidelity timing, but has its disadvantages. FLS on the other hand provides canned high-level timing simulation.

BRIEF SUMMARY OF THE INVENTION

In a Virtual Real Time (VRT) system as disclosed below, the timing fidelity is in between ILS and FLS. A VRT system provides for ease of development. It has reasonably high timing fidelity, approaching timing fidelity of ILS and good performance, close to the performance of FLS. The VRT system solution is also cost effective as compared to both ILS and FLS.

JPL's Mission Data System (MDS) software framework is used to develop and test VRT. MDS develops highly portable software that runs on multiple platforms—target platform and various workstations (Linux and Solaris operating system based). The adherence to standards and portable standard middle-ware by various vendors allows MDS to write portable code. MDS provides unified framework architecture for Flight, Ground and Simulation software development. Using MDS framework and software adaptations for Flight, Ground and Simulation, VRT operation was demonstrated.

Virtual Real Time (VRT) is defined as a measure of time resulting by the execution of CPU instructions in a UNIX/LINUX process on a Workstation. Since VRT is a measure of CPU instruction execution of a program (or process) running in a workstation, it could be related to the target CPU instruction execution running the same program, hence the high resolution accuracy of timing within a range can be claimed.

Scalability feature of VRT allows user to run the system faster than real time, provided host CPU performance allows it to do so. VRT is totally controllable. It is this feature that provides user the capability of starting, stopping and monitoring time. The control feature also provides synchronizing capability of simulator with other software models and packages in a distributed computing environment. Virtual real-time provide high-resolution timing usually in microseconds depending upon underlying workstation hardware and operating system.

In a VRT system synchronizing Flight, Simulation and Ground software deployments at tick can be done at a tick resolution. A tick size is adjustable by the user, usually in microseconds, depends on underlying software and hardware. VRT supports various testbed configurations: 1) All deployments in a Workstation environment; and 2) Flight running on a target hardware computer and Simulation and Ground running on a workstation.

VRT can synchronize Flight, Simulation and Ground deployments running on separate workstations for performance or other distributed computing benefits. Normally Flight and Simulation needs to be very tightly coupled (run in-synch at micro-second steps so that causality is not violated).

A set of programs executing together using Virtual Real-Time behaves, with respect to themselves, as though they were executing in real-time on target hardware. However, they execute like normal programs (i.e. in virtual or process time) insofar as an outside observer (i.e. the operator) is concerned. The programs can therefore be executed on a normal timeshared workstation where precise time allocation and coordination is not provided and performance is more, or less, or varying with respect to the target hardware, yet the programs interact with each other as though they were executing in real-time on the target hardware.

In particular, the invention is a virtual real time system for simulating a physical test environment comprising a master computer module; and at least one slave computer module communicated to the master computer module with a clocked operation, which is synchronized to the master computer module. The master computer module and the at least one each slave computer module each have a launcher submodule and a deployment submodule. The launcher submodule launches the deployment submodule and controls the deployment submodule for synchronized operation with the master computer module. The deployment submodule generates a virtual clock and follows the commands from the launcher submodule. The modules and submodules are comprised of computer code stored in software or firmware and implemented in a computer or other type of digital processor or controller circuit.

The launcher submodule in the master computer module is a central virtual real time controller for the system.

The deployment submodule in the master computer module generates a virtual clock signal based on process CPU instruction execution.

The system includes an operating system and the launcher submodule and the deployment submodule in the master computer module and in the slave computer module communicates via signals provided by the operating system.

The virtual real time system further comprises a test master computer submodule communicating with the master launcher submodule for configuring the system and advancing, starting, stopping, adjusting and monitoring virtual real time, and/or issuing time related commands to the deployment submodule in the master computer module.

The master deployment submodule generates a virtual clock signal and the test master computer submodule generates scale-up and/or scale-down commands of the virtual clock in the master deployment submodule.

The slave launcher submodule further comprises a slave launcher synch submodule and where the slave launcher submodule, upon receiving a command from the master launcher submodule, requests the corresponding slave deployment submodule via the slave launcher synch submodule to advance the slave deployment submodule by a predetermined number of virtual clock ticks and to stop, after which the slave deployment submodule suspends operation and waits for the slave launcher submodule to resume operation.

The master launcher submodule sends a start-tick command to only to the slave launcher submodule, if it is prepared to receive the next start-tick command by sending a socket call with a start-tick message.

The slave deployment submodule master deployment submodule each run and is included in a workstation, and the slave deployment is not necessarily running at the workstation where the master deployment submodule is running.

The slave launcher submodule after receiving a start-tick command from the master deployment submodule sends a SIGCONT signal to the suspended slave deployment submodule. The slave launcher submodule sends an acknowledgment message to the master launcher submodule. The slave deployment submodule runs for the requested number of ticks in parallel with other programs.

The master launcher submodule then sends a signal SIGCONT to its corresponding master deployment submodule to run a requested number of virtual clock ticks based on Vclk clock ticks which are generated, when the time consumed by execution of process CPU instructions is equal to or greater than tick-resolution time. The master deployment submodule suspends its operation after running the requested number and the master launcher submodule waits for the master deployment submodule to complete its cycles.

The master launcher submodule sends a stop-tick message to each slave launcher submodule which needs to be synchronized at that clock tick based on slave tick synchronize size and a stop-tick socket call is made to the candidate slave launcher submodule.

The slave launcher submodule after receiving a stop-tick command waits for a SIGSTOP signal from the slave deployment submodule to make sure that the requested number of virtual clock ticks has been completed, and the slave launcher submodule sends a stop-tick acknowledgment message to the master launcher submodule.

The invention also includes a method for executing the operation described above.

While the apparatus and system has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Virtual Real Time (VRT) provides high fidelity timing for software simulator environment running in a workstation. VRT is scalable and controllable. Virtual Real Time provides flight and simulation software synchronization mechanism. This feature guarantees that the causality effect between flight software when interacting with simulated devices (sensors, actuators and other processors etc.) is the same as running flight software in a real test-bed environment. VRT provides high-resolution timing, which facilitates monitoring and detection of timing related faults while running the simulation software system on a workstation. VRT is modularized, such that the switchover from virtual clock to real clock is a trivial task. Running the system on a workstation using VRT behaves exactly like a real system, with the added benefits of user controllable features such as start, stop, monitor and time-scale. Performance of systems running with VRT is generally very good, equal to or better than the hardware, as the software runs natively on a workstation.

In the following description, the reference is made to the accompanying drawings, which show, by way of illustration, specific embodiments in which the invention may be practiced. Some specific details of these embodiments are set forth in order to provide a thorough understanding of the invention.

Figure 1:
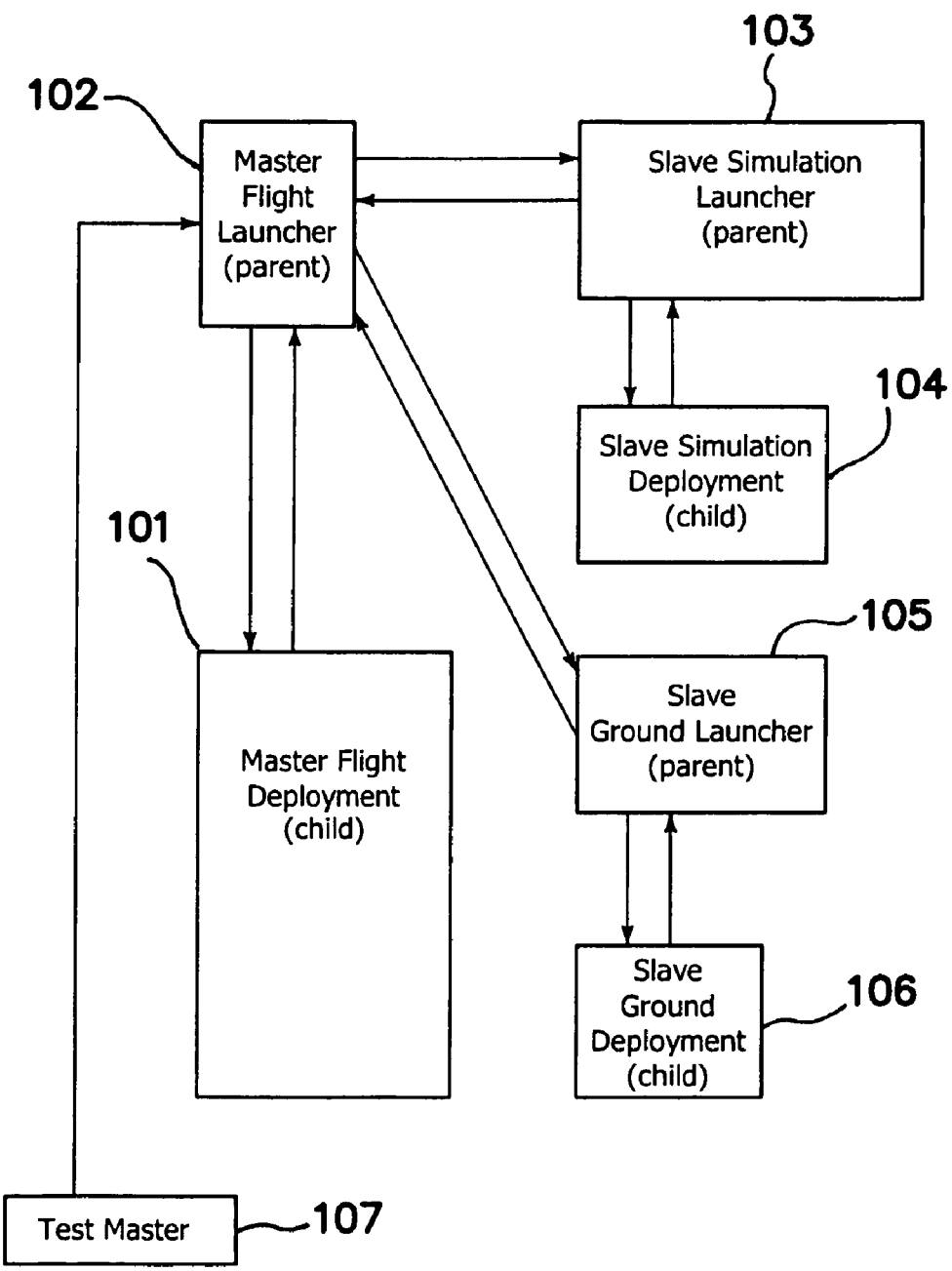
FIG. 1 is a block diagram of a typical test system with Flight, Ground and Simulation software being synchronized by VRT.

FIG. 1 illustrates a system configuration under which VRT was tested and validated. VRT can be configured in a variety of configurations of which FIG. 1 is only one example. FIG. 1 shows three software programs or computer modules being synchronized VRT—one master 102 and two slaves 103 and 105. It must be understood that any number of slave programs can be configured according to the teachings of the invention. Each program—Flight, Simulation and Ground software—has two executable programs, called a launcher and a deployment. A launcher's job is to launch its deployment and provide the necessary controls for VRT synchronization. A deployment is where the software program resides. Virtual clock ticks are generated from the deployment, and launcher controls it via VRT commands. The actual software program resides in the deployment. As an example Flight software program running as a Unix process would be a master deployment and Simulation software program running as a Unix process would be slave deployment. There would be a separate launcher program for Flight software—called a master launcher, and a separate launcher program for Simulation software—called a slave launcher The master launcher 102 starts the master deployment 101. Master launcher 102 is a parent and master deployment 101 is a child in terms of Unix processes. The master launcher 102 is the central VRT controller for the whole VRT based system. Master deployment 101 generates virtual clock ticks based on process CPU instruction execution. The communication between master launcher 102 with the master deployment 101 is via signals provided by the underlying operating system. Master launcher 102 controls and communicates to the slave launchers 103 and 105 via the operating system socket mechanism. Slave launchers 103 and 105 communicate to slave deployments 104 and 106 respectively via signals provided by the operating system. Test master 107 is responsible for configuring the system and advancing, starting, stopping, and monitoring virtual real time. It also issues appropriate time related commands to the various deployments.

Figure 2:
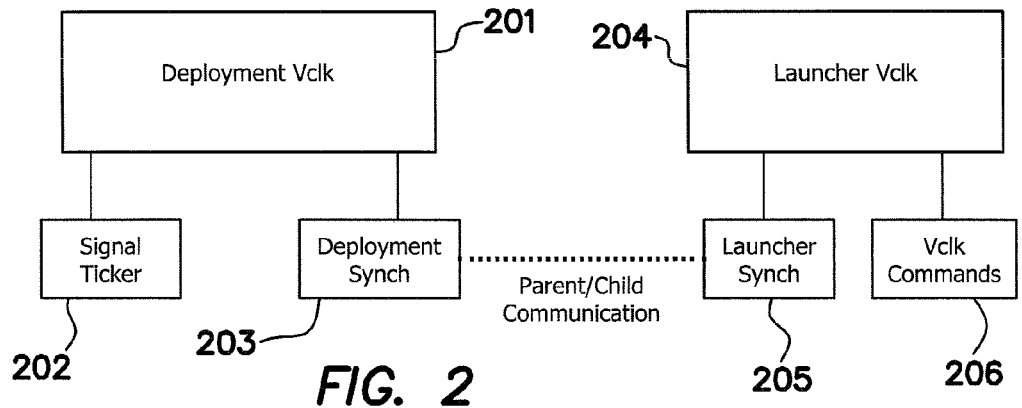
FIG. 2 shows block diagram of VRT design in a standalone configuration. This configuration is usually used for initial software testing or unit testing.

FIG. 2 shows the block diagram of a VRT standalone system. The blocks 102 and 101 in FIG. 1 include blocks 201, 202, 203, 204, and 206 in FIG. 2. The same system is shown in combination with slave modules in FIG. 3. The configuration of FIG. 2 is primarily used for unit testing in early software development. The deployment submodule is comprised of a deployment Vclk 201 communicated to a signal ticker 202 and deployment synchronizer 203. The launcher Vclk 204 is communicated to a launcher synchronizer 205 and launcher Vclk commands 206. Test master 107 can execute the Vclk commands. Vclk commands are for example, run, runForEver, runAbort, runStop, getVrtTime, setVrtTime, getScaleFactor setScaleFactor, setTickResolution, and getTickResolution. Run command runs the system for a specific period of time as specified by its arguments. The run time resolution is usually in milliseconds, though lower resolutions can be achieved. RunForEver command lets the system run indefinitely. The system can be stopped anytime using runAbort command. GetVrtTime gives the VRT time in millisecond resolution. The virtual real time normally starts from 0 and increments with VRT ticks. SetVrtTime allows user to set initial time. VRT clock speed could be adjusted scaled up or down using setScaleFactor command. This is usually done to match Workstation virtual clock with real hardware clock. The setTickResolution allow users to adjust the virtual clock synchronizing resolution among various software deployments. Virtual clock resolution is dependent on the operating system and the workstation hardware. Workstation vendors and operating system vendors are currently providing support for high-resolution clocks, usually in microsecond resolution or better.

Figure 3:
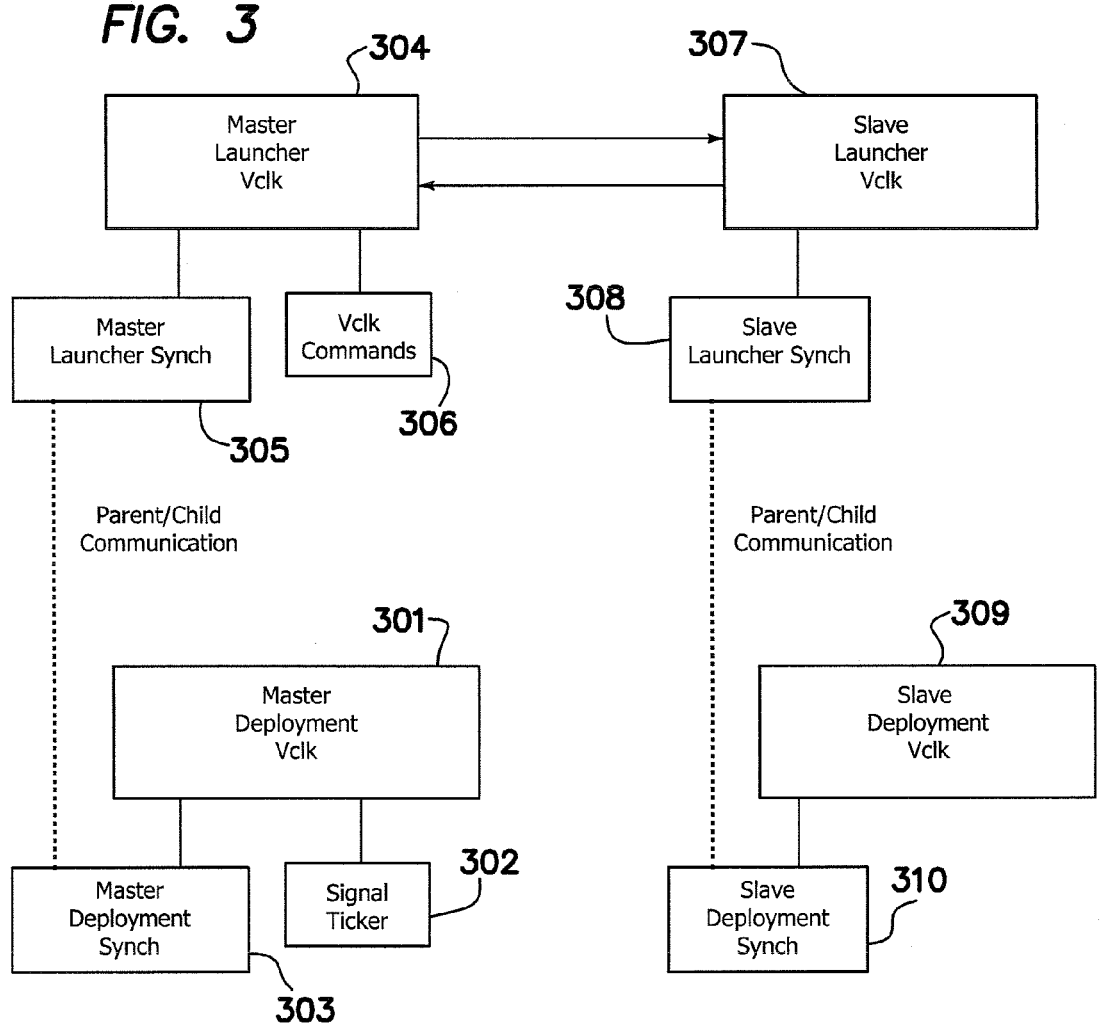
FIG. 3 illustrates block diagram of VRT design in system test configuration of Master/Slave. The example diagram illustrates a Master connected to one slave, but more than one slave can be easily connected to the same Master.

FIG. 3 shows a complete VRT based system with one master launcher module 304 controlling the master deployment module 301 and slave launcher module 307. The system shows one master controlling one slave, but more slaves could be easily added. The master diagram blocks 301, 302, 303, 304, 305 and 306 in FIG. 3 are identical to blocks 201, 202, 203, 204, 205 and 206 in FIG. 2 respectively. Slave launcher 307, upon receiving command from master launcher 304, requests its slave deployment 309 via slave launcher synch 308 to advance slave deployment 309 by x number of ticks and to stop. The slave deployment 309 waits for slave launcher 307 to resume the process.

Figure 4:
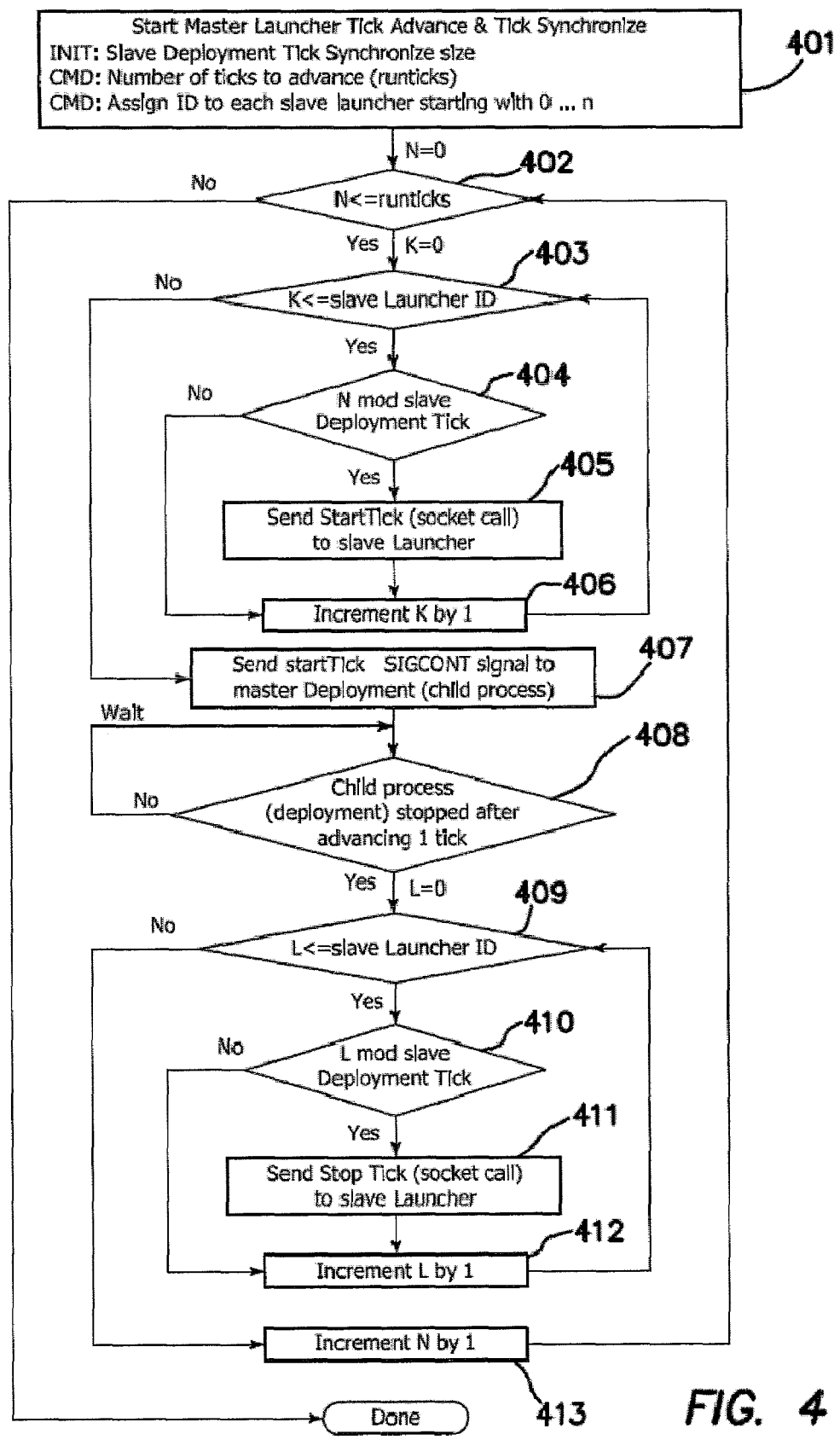
FIG. 4 shows the flow chart of a Master Launcher.

FIG. 4 provides a detailed flow chart of the master launcher 304, which controls and synchronizes the whole system on VRT ticks. The initial parameters such as slave deployment tick synchronize size, number of ticks to advance, assign id to each slave, tick resolution setup and scale factor setup is done in step 401. Master launcher 304 sends a start-tick command to only those slave launchers 307, which are prepared to receive the next start-tick command (steps 403, 404 and 405) i.e. where enough time has been allowed to synchronize with the master 304. A socket call with start-tick message is sent at step 405 to the slave launcher 307. The socket call helps VRT to support distributed computing, the slave deployment 309 need not be running at the workstation where master deployment 301 is running.

Figure 5:
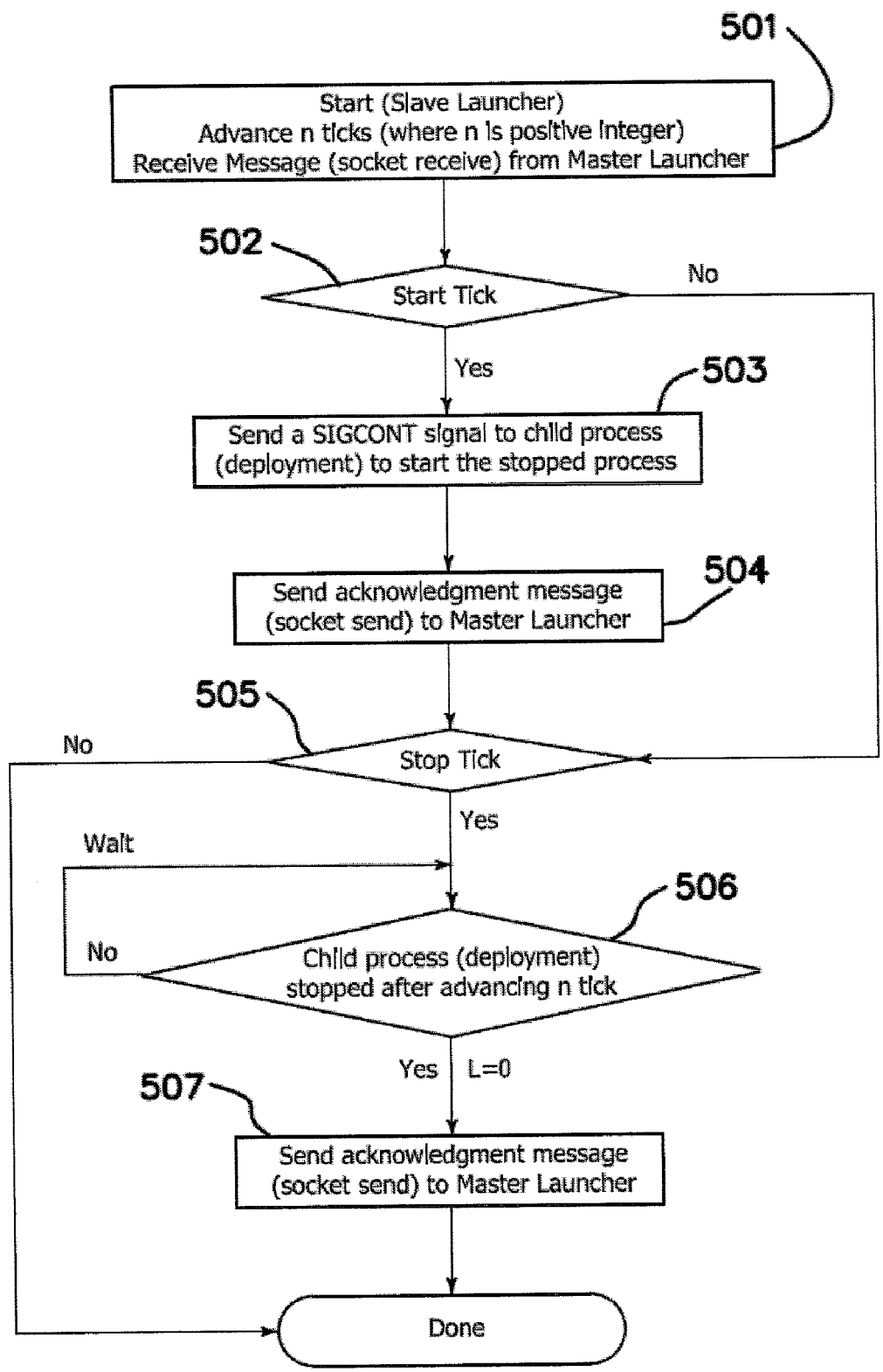
FIG. 5 shows the flow chart of a Slave Launcher.
Figure 6:
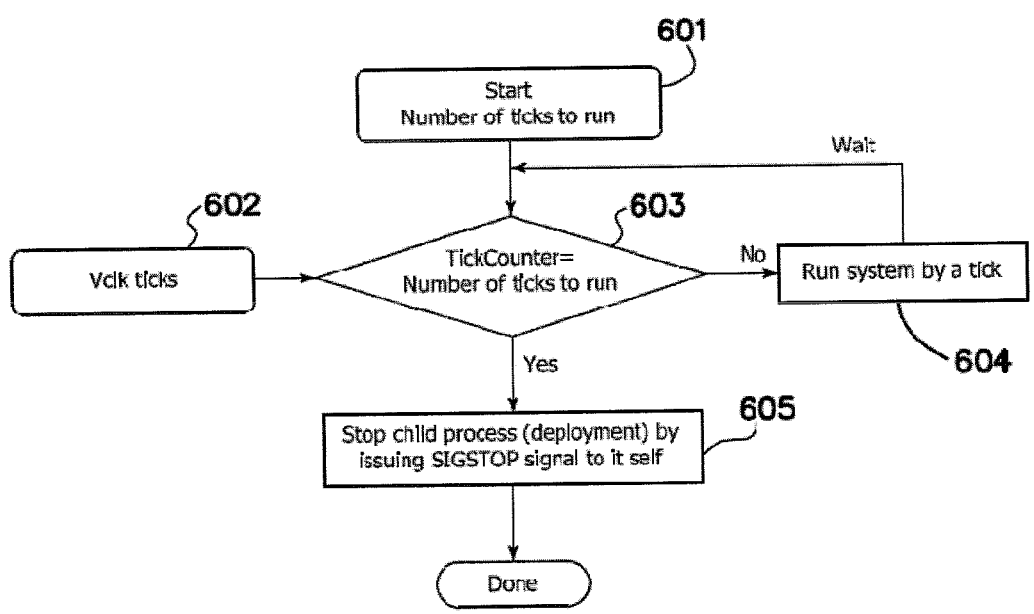
FIG. 6 shows flow chart of a Master or Slave Deployment.

FIG. 5 provides a detailed flow chart of the slave launcher 307, which controls the slave deployment 309 (via 308 and 310) and communicates with the master launcher 304. The slave launcher 307 at step 501 after receiving a start-tick command at step 503 from the master sends SIGCONT signal to the suspended slave deployment 309 as shown in FIG. 6 beginning at step 601. Slave launcher 307 sends an acknowledgment message at step 504 to the master launcher 304 at step 405. The slave deployment 309 in parallel with other programs runs the requested number of ticks generated at steps 602, 603, and 604.

The master launcher 304 then sends a signal SIGCONT at step 407 to its master deployment 301 at child process step 601. The child process runs the requested number of ticks at steps 603 and 604 based on Vclk ticks at step 602. The Vclk ticks are generated when the time consumed by execution of process CPU instructions is equal to or greater than tick-resolution time. The tick-resolution time is defined as the smallest increment or multiple of smallest increment of time of operation that the operating system allows for system or process to interrupt. The master deployment process suspends itself after running requested number of ticks at step 605. Master launcher 304 waits at step 408 for master deployment 301 to complete its cycles.

Master launcher 304 sends a stop-tick message to each slave launcher 307 at steps 409 and 412 that is needed to be synchronized at that tick based on slave tick synchronize size. A tick synchronize size is a smallest time step at which a slave program could synchronized with the master program without violating the causality effects between the two programs. A tick synchronize size is determined by the system designer. A stop-tick socket call is made to the candidate slave launcher 307 at step 411.

Slave launcher 307 after receiving a stop-tick command at step 505 waits for SIGSTOP signal from the slave (child) deployment 309 to make sure that the requested number of virtual ticks has been completed at steps 506 and 605. Slave launcher 307 sends a stop-tick acknowledgment message to the master launcher 304 at step 507.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A virtual real time system for simulating a physical test environment comprising:
   a master computer module;
   at least one slave computer module communicated to the master computer module and having a clocked operation, which is synchronized to the master computer module; wherein the master computer module and at least one each slave computer module each have a launcher submodule and a deployment submodule, the launcher submodule for launching the deployment submodule and controlling the deployment submodule for synchronized operation with the master computer module, the deployment submodule generating a virtual clock and following commands from the launcher submodule; and
   a test master computer submodule communicating with the master launcher submodule for configuring the system and advancing, starting, stopping, adjusting and monitoring virtual real time, and issuing time related commands to the deployment submodule in the master computer module.

2. The virtual real time system of claim 1 where the master deployment submodule generates a virtual clock signal and where test master computer submodule generates scale-up and/or scale-down commands of the virtual clock in the master deployment submodule during operation of the master deployment submodule.

3. A virtual real time system for simulating a physical test environment comprising:
   a master computer module; and
   at least one slave computer module communicated to the master computer module and having a clocked operation, which is synchronized to the master computer module; wherein the master computer module and at least one each slave computer module each have a launcher submodule and a deployment submodule, the launcher submodule for launching the deployment submodule and controlling the deployment submodule for synchronized operation with the master computer module, the deployment submodule generating a virtual clock and following commands from the launcher submodule, where the slave launcher submodule further comprises a slave launcher synch submodule and where the slave launcher submodule, upon receiving a command from the master launcher submodule, requests the corresponding slave deployment submodule via the slave launcher synch submodule to advance the slave deployment submodule by a predetermined number of virtual clock ticks and to stop, after which the slave deployment submodule suspends operation and waits for the slave launcher submodule to resume operation.

4. The virtual real time system of claim 3 where the slave launcher submodule after receiving a start-tick command from the master deployment submodule sends a SIGCONT signal to the suspended slave deployment submodule, the slave launcher submodule sends an acknowledgment message to the master launcher submodule, the slave deployment submodule in parallel with other programs runs the requested number of ticks.

5. The virtual real time system of claim 3 where the master launcher submodule then sends a signal SIGCONT to its corresponding master deployment submodule to run a requested number of virtual clock ticks based on Vclk clock ticks which are generated when the time consumed by execution of process CPU instructions is equal to or greater than tick-resolution time, the master deployment submodule suspends its operation after running the requested number and the master launcher submodule waits for the master deployment submodule to complete its cycles.

6. A virtual real time system for simulating a physical test environment comprising:
a master computer module; and
at least one slave computer module communicated to the master computer module and having a clocked operation, which is synchronized to the master computer module; wherein the master computer module and at least one each slave computer module each have a launcher submodule and a deployment submodule, the launcher submodule for launching the deployment submodule and controlling the deployment submodule for synchronized operation with the master computer module, the deployment submodule generating a virtual clock and following commands from the launcher submodule,
where master launcher submodule sends a start-tick command to the slave launcher submodule, only if it is prepared to receive the next start-tick command by sending a socket call with a start-tick message.

7. A virtual real time system for simulating a physical test environment comprising:
a master computer module; and
at least one slave computer module communicated to the master computer module and having a clocked operation, which is synchronized to the master computer module; wherein the master computer module and at least one each slave computer module each have a launcher submodule and a deployment submodule, the launcher submodule for launching the deployment submodule and controlling the deployment submodule for synchronized operation with the master computer module, the deployment submodule generating a virtual clock and following commands from the launcher submodule,
where the master launcher submodule sends a stop-tick message to each slave launcher submodule which needs to be synchronized at that clock tick based on slave tick synchronize size and a stop-tick socket call is made to a candidate slave launcher submodule.

8. The virtual real time system of claim 7 where the slave launcher submodule after receiving a stop-tick command waits for a SIGSTOP signal from the stave deployment submodule to make sure that the requested number of virtual clock ticks has been completed, and the slave launcher submodule sends a stop-tick acknowledgment message to the master launcher submodule.

9. A method for operating a virtual real time system for simulating a physical test environment comprising:
communicating at least one slave computer module with a master computer module, which at least one slave computer module has a clocked operation and is synchronized to the master computer module, wherein the master computer module and at least one each slave computer module each have a launcher submodule and a deployment submodule;
launching each of the deployment submodules corresponding to the launcher submodules;
controlling each of the deployment submodules by the corresponding launcher submodule for synchronized operation with the master computer module;
generating a virtual clock in the deployment submodule corresponding master computer module;
executing commands from the corresponding launcher submodule; and
communicating with the master launcher submodule with a test master computer submodule for configuring the system and advancing, starting, stopping, adjusting and monitoring virtual real time, and/or issuing time related commands to the deployment submodule in the master computer module during operation of the master deployment submodule.

10. The method of claim 9 where generating a virtual clock in the deployment submodule corresponding master computer module comprises generating scale-up and scale-down commands of the virtual clock in the master deployment submodule by means of the test master computer submodule.

11. A method for operating a virtual real time system for simulating a physical test environment comprising:
communicating at least one slave computer module with a master computer module, which at least one slave computer module has a clocked operation and is synchronized to the master computer module, wherein the master computer module and at least one each slave computer module each have a launcher submodule and a deployment submodule;
launching each of the deployment submodules corresponding to the launcher submodules;
controlling each of the deployment submodules by the corresponding launcher submodule for synchronized operation with the master computer module;
generating a virtual clock in the deployment submodule corresponding master computer module;
executing commands from the corresponding launcher submodule;
where the slave launcher submodule further comprises a slave launcher synch submodule; and where the slave launcher submodule, upon receiving a command from the master launcher submodule, requesting the corresponding slave deployment submodule via the slave launcher synch submodule to advance the slave deployment submodule by a predetermined number of virtual clock ticks and to stop, after which the slave deployment submodule suspends operation and waits for the slave launcher submodule to resume operation.

12. The method of claim 11 further comprising sending a SIGCONT signal to the suspended slave deployment submodule from the slave launcher submodule after receiving a start-tick command from the master deployment submodule, sending an acknowledgment message from the slave launcher submodule to the master launcher submodule, and running the slave deployment submodule in parallel with other programs the requested number of ticks.

13. The method of claim 11 further comprising sending a signal SIGCONT from the master launcher submodule to its corresponding master deployment submodule to run a requested number of virtual clock ticks based on Vclk clock ticks which are generated when the time consumed by execution of process CPU instructions is equal to or greater than tick-resolution time, suspending operation of the master deployment submodule after running the requested number, and forcing the master launcher submodule to wait for the master deployment submodule to complete its cycles.

14. A method for operating a virtual real time system for simulating a physical test environment comprising:
    communicating at least one slave computer module with a master computer module, which at least one slave computer module has a clocked operation and is synchronized to the master computer module, wherein the master computer module and at least one each slave computer module each have a launcher submodule and a deployment submodule;
    launching each of the deployment submodules corresponding to the launcher submodules;
    controlling each of the deployment submodules by the corresponding launcher submodule for synchronized operation with the master computer module;
    generating a virtual clock in the deployment submodule corresponding master computer module;
    executing commands from the corresponding launcher submodule; and
    sending a start-tick command to only to the slave launcher submodule from the master launcher submodule, if the slave launcher submodule is prepared to receive the next start-tick command by sending a socket call with a start-tick message.

15. A method for operating a virtual real time system for simulating a physical test environment comprising:
    communicating at least one slave computer module with a master computer module, which at least one slave computer module has a clocked operation and is synchronized to the master computer module, wherein the master computer module and at least one each slave computer module each have a launcher submodule and a deployment submodule;
    launching each of the deployment submodules corresponding to the launcher submodules;
    controlling each of the deployment submodules by the corresponding launcher submodule for synchronized operation with the master computer module;
    generating a virtual clock in the deployment submodule corresponding master computer module;
    executing commands from the corresponding launcher submodule; and
    sending a stop-tick message from the master launcher submodule to each slave launcher submodule which needs to be synchronized at that clock tick based on slave tick synchronize size and a stop-tick socket call is made to a candidate slave launcher submodule.

16. The method of claim 15 further comprising forcing the slave launcher submodule to wait after receiving a stop-tick command for a SIGSTOP signal from the slave deployment submodule to make sure that the requested number of virtual clock ticks has been completed, and sending a stop-tick acknowledgment message from the slave launcher submodule to the master launcher submodule.

* * * * *

UNITED STATES PATENT AND TRADEMARK OFFICE
CERTIFICATE OF CORRECTION

| | | |
|---|---|---|
| PATENT NO. | : 7,313,511 B2 | Page 1 of 1 |
| APPLICATION NO. | : 10/635392 | |
| DATED | : December 25, 2007 | |
| INVENTOR(S) | : Mohammad Shahabuddin and William K. Reinholtz | |

It is certified that error appears in the above-identified patent and that said Letters Patent is hereby corrected as shown below:

At col. 1, line 4, insert:

--Government Support
The invention described herein was made in the performance of work under a NASA contract and is subject to the provisions of Public Law 96-517 (35 USC 202) in the Contractor has elected to retain title.--

Signed and Sealed this

Twenty-sixth Day of August, 2008

JON W. DUDAS
*Director of the United States Patent and Trademark Office*